(12) United States Patent
Sarkar et al.

(10) Patent No.: US 11,889,216 B2
(45) Date of Patent: Jan. 30, 2024

(54) HIGH DYNAMIC RANGE CMOS IMAGE SENSOR HAVING MULTI-STEP VOLTAGE GAIN ENHANCEMENT FOR LOW LIGHT VISION

(71) Applicant: DV2JS INNOVATION LLP., New Delhi (IN)

(72) Inventors: Mukul Sarkar, New Delhi (IN); Neha Priyadarshini, New Delhi (IN)

(73) Assignee: DV2JS Innovation, LLP, New Delhi (IN)

(*) Notice: Subject to any disclaimer, the term of this patent is extended or adjusted under 35 U.S.C. 154(b) by 27 days.

(21) Appl. No.: 17/670,933

(22) Filed: Feb. 14, 2022

(65) Prior Publication Data

US 2022/0264043 A1  Aug. 18, 2022

(30) Foreign Application Priority Data

Feb. 15, 2021  (IN) .............................. 202111006235

(51) Int. Cl.
  *H04N 25/75*  (2023.01)
  *H01L 27/146*  (2006.01)
  *H04N 25/59*  (2023.01)
  *H04N 25/778*  (2023.01)

(52) U.S. Cl.
CPC ....... *H04N 25/75* (2023.01); *H01L 27/14612* (2013.01); *H01L 27/14643* (2013.01); *H04N 25/59* (2023.01); *H04N 25/778* (2023.01)

(58) Field of Classification Search
CPC ...... H04N 25/75; H04N 25/59; H04N 25/778; H04N 25/771; H01L 27/14612; H01L 27/14643
See application file for complete search history.

(56) References Cited

U.S. PATENT DOCUMENTS

| | | | |
|---|---|---|---|
| 11,323,639 B2 * | 5/2022 | Cho | H04N 25/625 |
| 2010/0118167 A1 * | 5/2010 | Johnson | H04N 25/46 348/E5.022 |
| 2016/0360138 A1 * | 12/2016 | Meynants | H01L 27/14636 |
| 2018/0070029 A1 * | 3/2018 | Centen | H04N 25/531 |
| 2018/0220094 A1 * | 8/2018 | Yang | H01L 27/14643 |

* cited by examiner

*Primary Examiner* — Shahbaz Nazrul
(74) *Attorney, Agent, or Firm* — Renner, Kenner, Greive, Bobak, Taylor & Weber

(57) ABSTRACT

A method and a system are disclosed for pixel-embedded signal amplification of a CMOS image sensor using multi-step voltage-gain enhancement. It involves activating a row of the CMOS image sensor by resetting switches SRST 202, SH1 201 and SH2 209 to charge nodes PD1, PD2, SD1, and SD2 to a pre-set voltage potential and VRST 203. The CMOS sensor switches OFF SRST 202, SH1 201 and SH2 209 for integration of the charges at PD1 for producing a corresponding photo-generated signal. This signal is sampled by transferring to a gate of source follower SF1, to produce an amplified signal. It further involves double-sampling the amplified signal for removing any pixel-offset variation to produce a resultant signal. The said method is repeated for second row of CMOS image sensor for implementing additional gain on the resultant voltage signal, and the same is finally converted to digital bits to obtain an output signal of with enhanced gain.

19 Claims, 3 Drawing Sheets

HIGH DYNAMIC RANGE CMOS IMAGE SENSOR HAVING MULTI-STEP VOLTAGE GAIN ENHANCEMENT FOR LOW LIGHT VISION

FIELD OF THE INVENTION

The present invention relates to an improved high dynamic range CMOS image sensors for low light vision. The improved high dynamic range CMOS image sensors provide an in-pixel signal enhancement technique which implements a cascade of amplifying steps making use of the MOS capacitor (MOS-CAP) amplification method. This invention also relates to a method of use of such an improved high dynamic range CMOS image sensor

BACKGROUND OF THE INVENTION

Digital photography has advanced in leaps and bounds, incorporating features of advanced cameras in compact photographic devices due to rapid developments in image processing techniques. In spite of the technological advancements, photography in low light conditions still poses a challenge to technologists working in this field. Even the available advanced cameras have failed to provide better efficiency and high resolution of picture in low-light conditions.

Availability of light is a fundamental requirement for any digital camera, to process a captured image and render a high-resolution image as an output. This is the very reason why photography in low-light conditions renders an image of inferior quality. Obtaining a high-resolution image in low-light conditions is very important when it comes to applications, inter alia, in medical equipment and warfare equipment. For instance, low-light imaging finds a necessary use in endoscopic capsule, fluorescence microscopy, astrophotography, night-vision optics and other surveillance applications.

There are image sensors available which have tried to attend the problems of low-light photography. However, the images rendered are of an inferior resolution and are normally laden with noise signals. This is because the input signal is weak due to presence of a fewer number of photons. As a result, a weak photoelectric signal is generated with a low voltage. Traditionally, state of the art sensors amplify this low-level voltage signal in order to obtain a high gain, to output a refined image. This process consumes more power and makes the digital camera expensive and less effective.

Traditionally, sensors like CCD (Charged Coupled Device), Electron bombardment CCDs, photomultiplier tubes, SPADs (Single Photon Avalanche Diodes) and conventional CMOS sensors are used in digital cameras for low-light photography. Conventional CCD image sensors were intended for low noise and high gain imaging. In an electron bombardment CCD, a photocathode made from GaAs, GaAsP (Gallium Arsenide and Gallium Arsenide Phosphide as substrates) is used for emission of photoelectrons in vacuum. Further, a high electric field is applied to accelerate the photoelectrons at high velocities and they are bombarded on the anode (Silicon). However, the multiplication is implemented by subjecting the electron to a high electric field in vacuum such that they bombard the Silicon anode with extremely high velocities. This creates a multiplication of electron-hole pairs which enhance the signal. High electric fields require high voltage and thus high-power consumption is expected. Using a vacuum tube makes the setup bulky. Thus, these imaging systems are costly. Further, the gain factor in traditional sensors is non-linear over time.

Similarly, photo multiplier tubes (PMTs) are based on the same principle of CCDs. This architecture uses phosphor screen as photo-cathodes which generates electrons in response to photon. The electrons travel through a high electric field in vacuum with high velocity. The electrons, now in a higher energy shell, are transferred through multi-channel photo multiplier tubes. Thereafter, they hit a screen made of phosphor which converts the high energy electrons back into light. Thus, in PMTs, a high gain is obtained due to increased number of photons, which in turn increases the photoelectric efficiency. The resultant effect is a requirement of additional hardware which makes a PMT circuitry bulky.

Single Photon Avalanche Diodes (SPADs) operate by applying a breakdown voltage in reverse bias condition so that the avalanche in the electric field produces multiple negatively charged carriers corresponding to a very few photons (or even one photon).

Similarly, in-pixel voltage amplifiers techniques are also used. These set of techniques are used when power is a critical constraint. Voltage amplifiers with a high gain like common source amplifier, capacitive transimpedance amplifier, operational amplifiers are used in the pixel to provide gain to the signal without using high voltages. But they take too much pixel area and also add significant noise to the signal. So, the performance of these In-pixel voltage amplifiers is limited.

Conventional CMOS sensors have enabled the single-chip design of an imaging system and have also provided a cost-effective alternative. However, conventional CMOS sensors suffer from low dynamic range (DR), when exposed to low-light or bright-light conditions, thereby affecting the image quality. A typical CMOS sensor overcomes the aforementioned problems of high dynamic range requirement, by amplifying the input signal. Most of the CMOS sensors use a static amplifier to amplify the pixel voltage. The resultant output is an electric signal (image), comparatively with a better resolution but laden with noise and with a compromised gain.

U.S. Ser. No. 10/419,701 relates to a digital pixel image sensor with a low integration time of light on a pixel, which comprises a digitizer, a photodiode, comparator, a clock counter, a charge storage device, and a pixel memory. More specifically, it discloses a digital pixel image sensor which includes a digitizer (e.g., ADC) in each pixel, where the digitizer digitizes an analogue-output from a photodiode of the pixel using a comparator, a reference ramp signal, and a counter. A pixel includes a digital or an analogue-correlated-double sampling (CDS) circuit to reduce noise and provide a higher dynamic range. Further, the disclosed comparator has a pre-charging circuit, rather than a constant biasing circuit, to reduce the power consumption of each digital pixel.

U.S. Ser. No. 10/070,084 relates to a device for increasing the dynamic range of an image sensor. The image sensor uses spatial adaptive on-chip binning to enhance low-light photography. This image sensor fundamentally works on combining at least two signals to render a high-resolution image in low light environments. The image sensor comprises a plurality of pixels, at least two shift registers, and one amplifier for processing at least two images. Thus, US '084 works by producing two images and processing a resultant image by comparing the ideal features from both the images, thereby having a longer clock cycle.

The available Image intensifiers, Multichannel plates, electron bombardment devices and photo-multiplier tubes are extremely bulky. They use high voltages, and are thus very power hungry/power consuming as well. As a result, many applications which require small dimension cameras and can't afford a high-power budget are unable to incorporate these methods. Another issue is that analog signal processing units have to be included separately. They cannot be integrated onto the same substrate of the device responsible for photon to electron conversion. This adds to the already bulky size. Even in simple charge coupled devices, the processing and storage cannot be integrated on the same chip.

Thus, reducing the bulkiness is possible only with CMOS since all functionality can be included on the same chip in less area. The SPADs and in-pixel amplifiers are better than the above stated methods in terms of sensor area. However, SPADs also use high voltage inputs and power to create an avalanche.

Thus, there is a need for an in-pixel technique for low light cameras which can replace the already known techniques and provide a gain without significantly affecting the pixel area, power budget and noise performance.

It is therefore the object of the present invention to provide an improved high dynamic range CMOS image sensor with a high pixel gain for low light vision. Thus, it is the intent of the present invention to provide advantageous combinations of features not afforded or suggested by the prior CMOS, including certain particular features not disclosed at all in the prior publications.

SUMMARY OF THE INVENTION

There is a need for a more effective, competent, efficient, economical, low-power-consuming and a high dynamic range CMOS image sensor, which uses an in-pixel signal enhancement technique which implements a cascade of amplifying steps making use of the MOS capacitor (MOS-CAP) amplification method and provide better result in low light condition.

The present invention relates to an improved high dynamic range CMOS image sensor using multi-step voltage gain enhancement to enhance the signal to noise ratio (SNR) in the low-light environment.

The improved high dynamic range CMOS image sensor is configured to operate in such a way that two or more than two pixels working in tandem with each other to provide a multi-step gain before the signal is readout.

The improved high dynamic range CMOS image sensor uses in-pixel amplification and the high pixel gain is a result of a noise free voltage amplification step added before each source follower of the pixel. Two pixels belonging to two adjacent rows are combined to form a loop in which multiple steps of gain can be implemented to get a very high gain before reading out the signal.

The improved high dynamic range CMOS image sensor includes a novel arrangement of the in-pixel amplifier, a plurality of externally supplied control clocks, a plurality of switches, a column current source, a plurality of parasitic capacitances and a plurality of reset voltage. The CMOS sensor implements the method of in-pixel (photo-signal) amplification to enhance the signal-to-noise ratio in the low-light environment.

In another aspect of the invention, the improved high dynamic range CMOS image sensor operates when the first row is activated; the second row provides the in-pixel amplifier and buffer to the first row for its signal amplification. Similarly, when the second row is integrated, the first row's in-pixel amplifier and buffer are used to amplify the second-row signal. Thus, two pixels belonging to two adjacent rows are combined to form a loop in which multiple steps of gain can be implemented to get a very high gain before reading out the signal.

In another aspect of the invention, a digital camera uses an image sensor formed out of an array of photosensitive pixels to capture an incident light. Further, an image processor is linked to the CMOS image sensor. Further, the CMOS image sensor determines corresponding intensities of individual components of light by measuring the amount of accumulated charge in each type of pixel.

Accordingly, respective components of light captured by the pixels, are represented in the resulting digital image, which for instance may be red, green and blue colour components, although other digital colour representations exist as well. Also, a memory is present which is communicatively connected to the processor and stores processor instructions. The memory on execution, causes the processor to receive light for a predetermined duration on a pixel array and implement the method for pixel-embedded signal amplification.

According to an embodiment illustrated herein, the present disclosure relates to a method for pixel-embedded signal amplification of a CMOS image sensor using multi-step voltage gain enhancement, and the method includes, first, resetting the CMOS sensor circuit to drain residual current from previous clock cycles. The method involves:

1. activating ROW1 of the CMOS image sensor by resetting a plurality of switches $S_{RST}$ 202, $S_{H1}$ 201 and $S_{H2}$ 209 to charge nodes $PD_1$, $PD_2$, $SD_1$, and $SD_2$ to a pre-set voltage potential and $V_{RST}$ 203 respectively;
2. switching the plurality of switches OFF $S_{RST}$ 202, $S_{H1}$ 201 and $S_{H2}$ 209 for integration of photo-generated charges at node $PD_1$ for producing a corresponding photo generated signal;
3. sampling the photo generated signal by transferring the said signal to a gate of source follower $SF_1$, to produce an amplified photo generated signal;
4. double sampling the amplified photo generated signal in column for removing any pixel offset variation to produce a resultant voltage signal;
5. repeating the said steps for ROW2 for implementing multiple steps of gain on the resultant voltage signal; and
6. converting the resultant voltage to digital bits to obtain an output signal of with enhanced gain.

Further, the above entire operation is repeated for ROW2 with ROW1 circuitry shared for amplification and thus, the improved high dynamic range CMOS image sensors provides significantly better noise performance than other voltage amplifiers.

The summary is provided to introduce the system and method of representative concepts in a simplified form that are further described below in the detailed description. This summary is not intended to limit the key essential features of the present invention nor its scope and application.

Other advantages and details about the system and the method will become more apparent to a person skilled in the art from the below detailed description of the invention when read in conjugation with the drawings.

BRIEF DESCRIPTION OF THE DRAWINGS

The accompanying drawings, which are incorporated herein constitute a part of this disclosure, illustrate exemplary embodiments and together with the description, serve to explain the disclosed invention. In the figures, the digit(s)

of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

Figure 1:
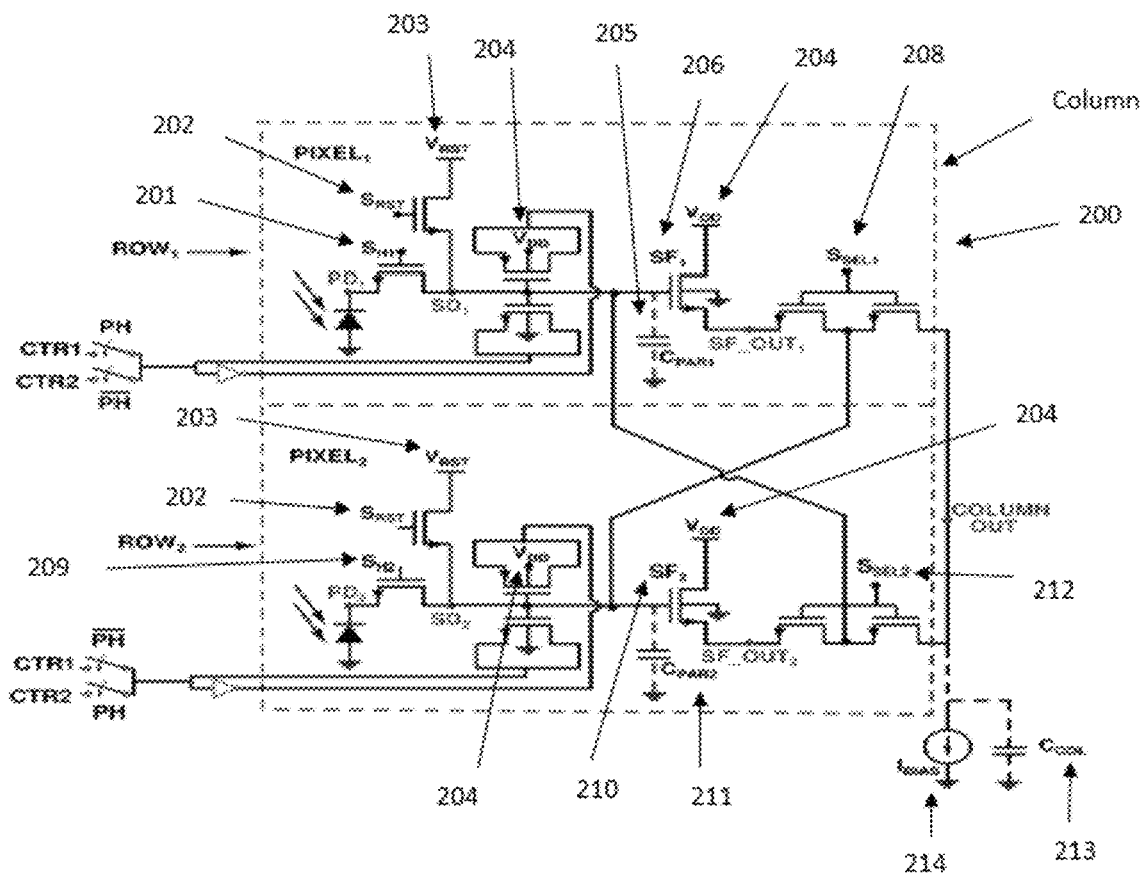
FIG. 1 is a block diagram that illustrates circuit architecture of the improved high dynamic range CMOS image sensor in accordance with the present invention.

It should be appreciated by those skilled in the art that any block diagram herein represents conceptual views of illustrative systems embodying the principles of the present subject matter. Similarly, it will be appreciated that any flow charts, flow diagrams, state transition diagrams, illustrative circuit architectures, and the like represent various processes which may be substantially executed by a computer or processor, whether or not such computer or processor is explicitly shown.

DETAILED DESCRIPTION OF ILLUSTRATIVE EMBODIMENTS

The present invention can be best understood with reference to the detailed figures and description set forth herein. Various embodiments are discussed below with reference to the figures. However, those skilled in the art will readily appreciate that the detailed descriptions given herein with respect to the figures are simply for explanatory purposes as the methods and systems may extend beyond the described embodiments. For example, the teachings presented and the needs of a particular application yield multiple alternative and suitable approaches to implement the functionality of any detail described herein. Therefore, any approach extends beyond the particular implementation choices in the following embodiments described and shown.

References to "one embodiment," "at least one embodiment," "an embodiment," "one example," "an example," "for example," and so on indicate that the embodiment(s) or example(s) may include a particular feature, structure, circuit, architecture, characteristic, property, element, or limitation but that not every embodiment or example necessarily includes that particular feature, circuit, architecture, structure, characteristic, property, element, or limitation. Further, repeated use of the phrase "in an embodiment" does not necessarily refer to the same embodiment.

It is to be understood that the singular forms "a," "an," and "the" include plural referents unless the context clearly dictates otherwise.

The terms and words used in the following description are to be understood in the manner used by the inventor to enable and describe the invention. For further clarity and to enable better understanding of the invention, certain abbreviations/key terms are being defined herein under.

| Abbreviations | Meaning |
| --- | --- |
| PD | Photodiode/Photodetector |
| $S_{RST}$ | Signal for the reset switch of all pixels |

-continued

| Abbreviations | Meaning |
| --- | --- |
| $S_H$ | Sample and hold switch |
| $V_{RST}$ | Reset voltage to all pixels |
| SF | In-pixel source follower buffer |
| $C_{PAR}$ | Parasitic capacitance |
| CTR and PH | Externally supplied control clocks |
| $S_{SEL}$ | Select Switch |
| $I_{BIAS}$ | Column current source |
| $C_{COL}$ | Parasitic capacitance of column line |
| SD | Storage node |

The improved high dynamic range CMOS image sensor operates by pixel-embedded signal amplification to enhance the signal to noise ratio (SNR) in the low-light environment. The improved high dynamic range CMOS image sensor is configured to operate in the method described that two or more than two pixels working in tandem with each other to provide a multi-step gain before the signal is readout.

The improved high dynamic range CMOS image sensor uses in-pixel amplification and the high pixel gain is a result of a noise free voltage amplification step added before each source follower of the pixel. Two pixels belonging to two adjacent rows are combined to form a loop in which multiple steps of gain can be implemented to get a very high gain before reading out the signal.

The improved high dynamic range CMOS image sensor in accordance to the present invention enhances the following:
- signal to noise ratio (SNR) in low light environment using the CMOS image sensor;
- signal by amplification in the pixel. The signal is amplified by two or more than two pixels working in tandem with each other to provide a multi-step gain before the signal is readout;
- image sensor conversion gain and pixel gain with the use of the MOS capacitor (MOS-CAP) amplification method;
- the amplification is based on a change in capacitance and involves no active components, the amplification process adds no noise to the signal;
- consumes less area such that pixel fill factor is not significantly compromised;
- consumes less power and does not use high voltages; and
- does not increase system noise significantly as the commonly used voltage amplifiers do.

The improved high dynamic range CMOS image sensor is more effective, competent, efficient, compact, consumes less power, sensitive and economical and implements a cascade of amplifying steps making use of the MOS capacitor (MOS-CAP) amplification method, to enhance the signal to noise ratio is the low-light environment. Since the amplification is based on a change in capacitance and involves no active components, the amplification process adds no noise to the signal and provides better result. Further, the MOS capacitors are of nMOS and pMOS types. Thus, the present improved high dynamic range CMOS image sensor provides a high amplification pixel in the not significantly compromised. Further, it also consumes less power during low-light photography and does not increase system noise significantly as the commonly used/conventional voltage amplifiers do.

The present invention discloses an improved high dynamic range CMOS range sensor whose gain implementation is power efficient and area efficient. The present invention also employs a multiplicative gain formula with the use of a pair of MOS capacitor amplifiers and buffers. The present invention discloses two or more pixels working in tandem with each other to provide a multi-step gain before the signal is readout. As a result, it provides a high gain signal with less noise in the low light environment.

The improved high dynamic range CMOS image sensor includes a novel arrangement of an in-pixel amplifier, plurality of externally supplied control clocks, a plurality of switches, a column current source, a plurality of parasitic capacitances and a plurality of reset voltage. The novel arrangement implements the method of in-pixel (photosignal) amplification to enhance the signal to noise ratio in the low-light environment.

FIG. 1 is a block diagram that illustrates circuit architecture of the improved high dynamic range complementary metal-oxide semiconductor (CMOS) image sensor 200. The circuit architecture of the improved high dynamic range CMOS image sensor 200 includes:

a plurality of switches ($S_{H1}$ 201, $S_{RST}$ 202, $S_{H2}$ 209, $S_{SEL1}$ 208 and $S_{SEL2}$ 212),
a plurality of In-pixel source follower buffer ($SF_1$ 206 and $SF_2$ 210),
a plurality of reset voltage ($V_{RST}$ 203),
a plurality of parasitic capacitances ($C_{COL}$ 213, $C_{PAR1}$ 205 and $C_{PAR2}$ 211) and
a column current source ($I_{BIAS}$ 214).

In an embodiment, the photodetector used is a pinned photodiode in every pixel in the pixel array. The pixel array includes a plurality of pixel cores as a unit of area, where light is incident on the pixel cores (or pixels). The pixel array includes a plurality of pixels as a unit of area, where light is incident on the plurality of pixels. Each pixel core has a photodiode, which is sensitive to incident light of the visible spectrum. The pixel array is communicatively coupled to the column readout, which is a circuit used to convert information on variation of capacitance due to an external acceleration into a voltage signal. It is mainly a photocurrent in voltage terms read from the pixel array. The column readout is connected to the column decoder which selects pairs of bit lines from the pixel array and represents the data stored in bits as a readable output.

In one embodiment, to read out the amplified signal of the first row ROW1 after gain enhancement, PH signal is turned high. Thus, the source-drain of MOS-CAP amplifier of the first row receives CTR1 signal and the second row receives CTR2 signal by pushing decoder (DEC) high. Thus, the first step is the activation step wherein ROW1 of CMOS image sensor is activated by resetting a plurality of switches $S_{RST}$ 202, $S_{H1}$ 201 and $S_{H2}$ 209 to charge nodes $PD_1$, $PD_2$, $SD_1$, and $SD_2$ to a pre-set voltage potential and $V_{RST}$ 203 respectively.

So the signal in ROW1 will enter from photodiode $PD_1$ when the switches $S_{H1}$ 201, $S_{RST}$ 202 and $S_{H2}$ 209 are ON. The $S_{H1}$ 201 is a sample and hold switch to transfer the photo-generated signal from photodiode node to gate of source follower for all odd row pixels i.e. ROW1. The signal from switch $S_{H1}$ 201 will move to switch $S_{RST}$ 202 which provides the signal for the reset switch of all pixels. Further, $V_{RST}$ 203 will reset voltage to all pixels and the potential of $V_{RST}$ 203 is formed after switch ON of $S_{H1}$ 201, $S_{RST}$ 202 and $S_{H2}$ 209. The photo-generated charges at $PD_1$ begin to integrate and the potential $V_{RST}$ 203 is held at the storage node $SD_1$ and produces a corresponding photo generated signal. The collected charges will be then dumped on $SD_1$ by switching Stu 201 ON and two capacitors. The bulk of one capacitor is connected to $V_{DD}$ 204 and the bulk of the other capacitor is connected to ground. One capacitor is connected to $V_{DD}$ 204 which can be made controllable and with the control of $V_{DD}$ 204, the capacitance can be controlled. The other method to control the capacitance is using the CTR1 and CTR2 when PH and PH(bar) is used. The drain-source voltage of the capacitors are externally connected to CTR1 and CTR2, which are user controlled and therefore, allowing variations in the capacitance. Then the signal through $V_{RST}$ 203 is passed through the multiplication loop with the help of clock $S_{SEL1}$ 208 and $SF_1$ 206 In-pixel source follower buffer for odd row pixels. The reset is readout after travelling through the multiplication loop.

The $SD_1$ node is reset again by turning ON $S_{RST}$ 202. Meanwhile the photo-signal continues to integrate on the $PD_1$ node. After the integration time of ROW1, the signal is sampled on $SD_1$ by turning $S_{H1}$ 201 ON. This time, the photo-signal is passed through the multiplication loop by using the pixel shared network controlled using CTR1, $S_{SEL1}$ 208, CTR2 and $S_{SEL2}$ 212. The sampling of the signal, thus involves sampling the photo generated signal by transferring the said signal to a gate of source follower $SF_1$, to produce an amplified photo generated signal.

The column receives the reset signal and photo-generated signal after passing through the multiplication loop. A double sampling circuit in the column produces the resultant difference between reset and photo-signal. The double sampling circuit removes the pixel offset variation.

In another embodiment, when the first row ROW1 is activated, the second row ROW2 provides the MOS cap amplifier and buffer to the first row ROW1 for its signal amplification. Similarly, when the second row ROW2 is integrated, the first row's MOS cap structure and buffer are used to amplify the second-row signal.

To read out the amplified signal of the second row ROW2 after gain enhancement, the procedure described above for ROW1 is repeated for the second row ROW2. PH is a clock and when turned low, the CTR2 signal goes to the first row and the CTR1 signal goes to the second row ROW2. After the signal integration time, $S_{H2}$ 209 turns ON to transfer the signal at node $SD_2$.

The switch $S_{RST}$ 202 is used to reset the storage node $SD_1$ and $SD_2$. Further, $V_{RST}$ 203 is the reset voltage to all pixels and is predetermined. The photo-generated charges at $PD_2$ begin to integrate and the potential $V_{RST}$ 203 is held at the storage node $SD_2$. The collected charges will then be dumped on $SD_2$ by switching $S_{H2}$ 209 ON and two capacitors. One capacitor is connected to $V_{DD}$ 204 which can be made controllable and with the control of $V_{DD}$ 204, the capacitance can be controlled. The other method to control the capacitance is using the CTR1 and CTR2 when PH and PH(bar) is used. The drain-source voltage of the capacitors are externally connected to CTR1 and CTR2, which are user controlled and therefore, allowing variations in the capacitance.

Then the storage node $SD_2$ is passed through the multiplication loop with the help of clock $S_{SEL2}$ 212 and SF2 210 In-pixel source follower buffer for even row pixels. The signal is readout after travelling through the multiplication loop. In the ROW1, Parasitic capacitance $C_{PAR1}$ 205 formed at the gate node of the source follower due to all connected transistors to that node for each odd row pixel and in ROW2 Parasitic capacitance $C_{PAR2}$ 211 formed at the gate node of the source follower due to all connected transistors to that node for each even row pixel.

Thus, when the first row ROW1 is activated, the second row ROW2 provide the MOS cap amplifier and buffer to the first row ROW1 for its signal amplification. Similarly, when the second row ROW2 is integrated, the first row's MOS cap structure and buffer are used to amplify the second-row signal.

The $SF_1$ 206 and $SF_2$ 210 are biased using column current source $I_{BIAS}$ 214. The pixel signal after amplification is transferred to the parasitic capacitance of the column line $C_{COL}$ 213 and will provide an amplified gain signal for low light photography.

Figure 2:
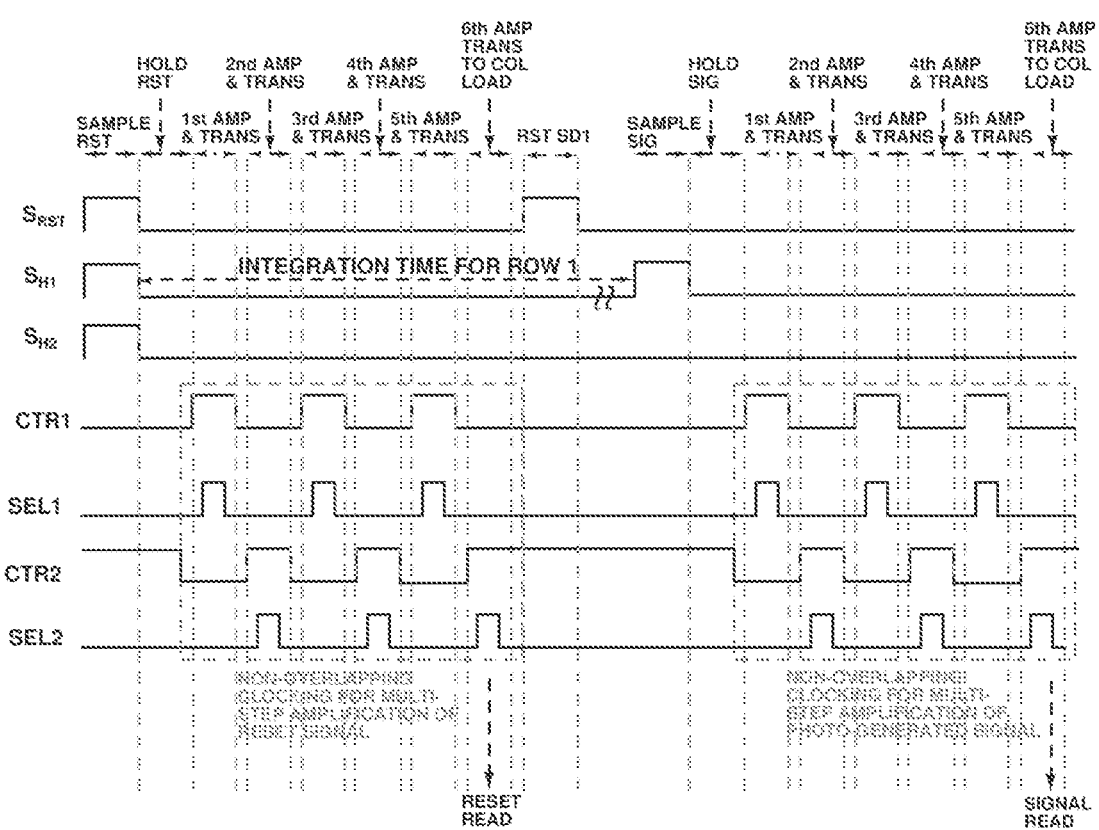
FIG. 2 is a timing diagram of the improved high dynamic range CMOS image sensor in accordance with the present invention.

FIG. 2 illustrates the timing diagram of the improved high dynamic range CMOS image sensor 200. The step wise operation can be explained with the help of the timing diagram and is given as follows.

Stage 1: To read out the amplified signal of the first row ROW1 after gain enhancement: PH signal is turned high. Thus, the source-drain of MOS-CAP amplifier of the first row ROW1 receives CTR1 signal and the second row ROW2 receives CTR2 signal by pushing decoder (DEC) high.

Reset readout: $S_{RST}$ 202, $S_{H1}$ 201 and $S_{H2}$ 209 are turned ON to reset the nodes $PD_1$, $SD_1$, $PD_2$ and $SD_2$ to known potential $V_{RST}$ 203. Then, $S_{RST}$ 202, $S_{H1}$ 201 and $S_{H2}$ 209 are turned OFF. The photo-generated charges at $PD_1$ begin to integrate and the potential $V_{RST}$ 203 is held at the $SD_1$. Then $V_{RST}$ 203 is passed through the multiplication loop indicated in the timing diagram with the help of clocks CTR1, $S_{SEL1}$ 208, CTR2, $S_{SEL2}$ 212. The reset is readout after travelling through the multiplication loop.

Signal readout: The $SD_1$ node is reset again by turning ON $S_{RST}$ 202. Meanwhile the photo-signal continues to integrate on the $PD_1$ node. After the integration time of ROW1, the signal is sampled on $SD_1$ by turning $S_{H1}$ 201 ON. This time, the photo-signal is passed through the multiplication loop by using the pixel shared network controlled using CTR1, $S_{SEL1}$ 208, CTR2 and $S_{SEL2}$ 212.

The column receives the reset signal and photo-generated signal after passing through the multiplication loop. A double sampling circuit in the column produces the resultant difference between reset and photo-signal. The double sampling circuit removes the pixel offset variation.

Stage 2: To read out the amplified signal of the second row ROW2 after gain enhancement: The procedure described above is repeated for the second row ROW2. PH is turned low. This time, the CTR2 signal goes to the first row ROW1 and the CTR1 signal goes to the second row ROW2. After the signal integration time, $S_{H2}$ 209 turns ON to transfer the signal at node $SD_2$. All other steps remain exactly the same as stage 1.

The gain enhancement is implemented through a capacitance change in the substrate of the two-transistor amplifier at the SD node of each pixel. Since the amplification process involves no active components, it provides significantly better noise performance than other voltage amplifiers.

In another embodiment of the invention, a method for pixel embedded signal amplification using the improved high dynamic range CMOS image sensor 200 is disclosed.

The method includes:
Resetting the CMOS sensor
Activation of ROW1;
Photo signal of ROW1 is simultaneously integrated;
Sampling of photo generated signal;
Enhancement in gain of photo generated signal;
Double sampling in column; and
Resultant voltage is converted to digital bits.
Further, the above entire operation is repeated for ROW2 with ROW1 circuitry shared for amplification and thus, the improved high dynamic range CMOS image sensors provides significantly better noise performance than other voltage amplifiers.

Figure 3:
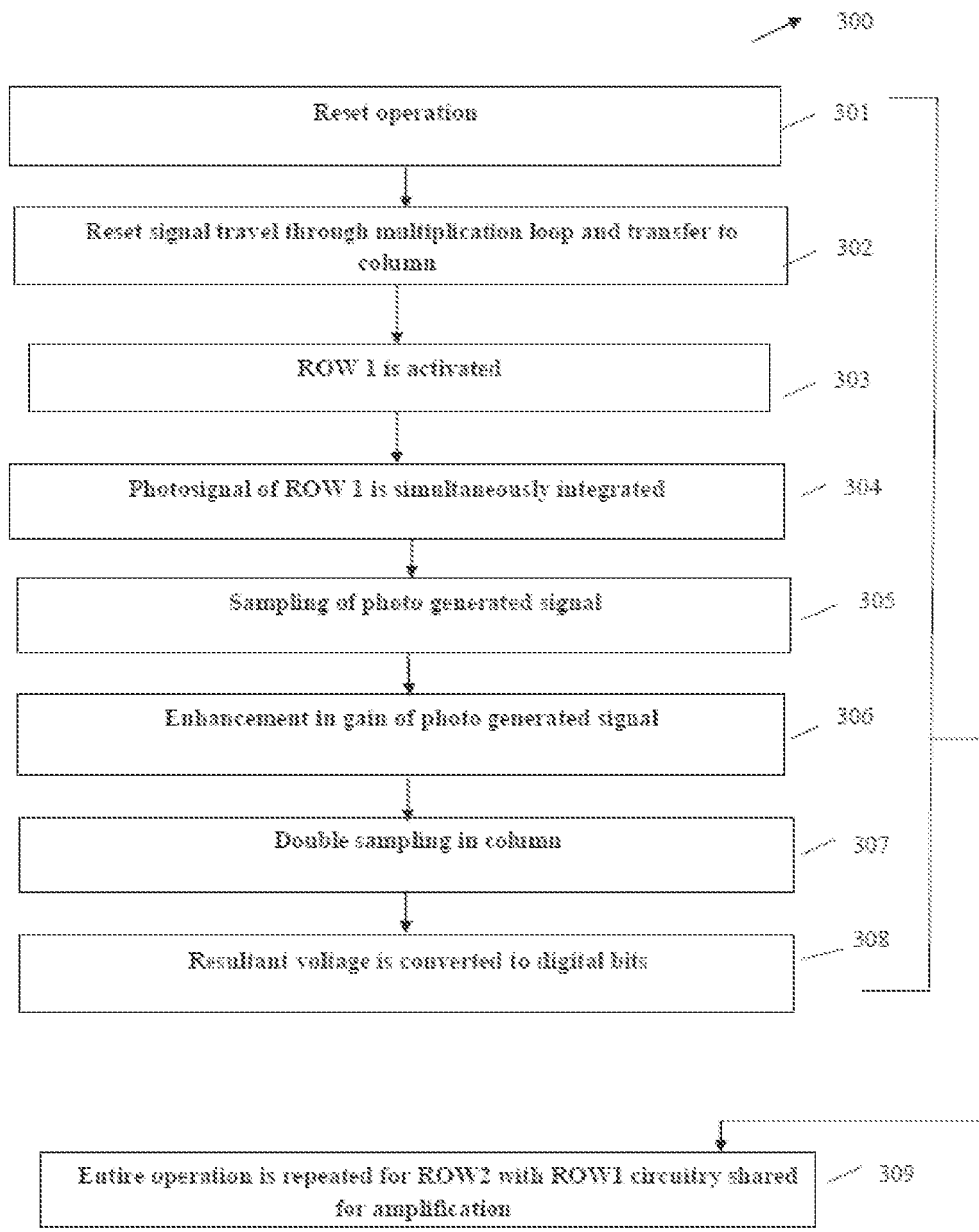
FIG. 3 is a flow chart that illustrates a method for pixel-embedded signal amplification using the improved high dynamic range CMOS image sensor in accordance with the present invention.

FIG. 3 is a flow chart 300 that illustrates a method for pixel-embedded signal amplification using the improved high dynamic range CMOS image sensor 200.

Initially, the ROW1 is activated and ROW2 circuitry is shared with ROW1 for amplification.

At step 301, reset operation is performed i.e. all photodiode of the pixel array are reset. Then at step 302, the reset signal travel through multiplication loop and transfer to column and at step 303, ROW1 is activated. Thus, the reset signal travels through the multiplication loop using the shared pixel architecture and then the reset signal is transferred to column.

At step 304, the photosignal of ROW1 is simultaneously integrated and after integration time, photo signal is transferred to gate of source follower i.e. sampling of the photo generated signal is performed at step 305.

Then at step 306, there is enhancement in gain of photo generated signal i.e. multiplication in photo generated signal. As a result of multiplication, there is gain to the photo generated signal is enhanced using the shared pixel architecture. Further, the amplified photo generated signal will transferred to the column.

Then at step 307, there is double sampling of the photo generated signal in column. The photo generated signal is readout from a source follower which has been switched, thus, the photo generated signal has a suppressed low-frequency noise and the signal is stored in the column.

Thereafter, at step 308, the resultant voltage is converted to digital bit and an improved signal is observed.

Finally, at step 309, entire operation as mentioned in steps 301 to 308 is repeated for ROW2 with ROW1 circuitry shared for amplification.

Thus, as a result of above-mentioned amplification method, following is observed:
High dynamic range CMOS image sensor
Low light imaging
Low noise image sensor
Image sensor conversion gain
Pixel gain
High sensitivity Thus, the present invention provides a novel arrangement of Pixel design of high dynamic range CMOS image sensor which includes multi-step gain and there is enhancement in pixel sensitivity. The improved high dynamic range CMOS image sensor achieves high pixel sensitivity and minimal extra hardware and also is economical, low power consuming, area-efficient image sensor ICs for low light imaging applications.

The digital camera uses an image sensor formed out of an array of photosensitive pixels to capture an incident light. Further, an image processor is linked to the CMOS image sensor. Further, the CMOS image sensor determines corresponding intensities of individual component of light by measuring the amount of accumulated charge in each type of pixel. Accordingly, respective components of light captured by the pixels, are represented in the resulting digital image, which for instance may be red, green and blue colour components, although other digital colour representations exist as well. Also, a memory is present which is communicatively connected to the processor and stores processor instructions. The memory on execution, causes the processor to receive light for a predetermined duration on a pixel array and implement the method for pixel-embedded signal amplification.

The memory may include suitable logic, circuitry, interfaces, and/or code that are configured to store the set of instructions, which is executed by the processor. The memory is configured to store one or more programs, routines, or scripts that is executed in coordination with the processor. The memory may be implemented based on a Random Access Memory (RAM), a Read-Only Memory (ROM), a Hard Disk Drive (HDD), a storage server, and/or a Secure Digital (SD) card.

A description of an embodiment with several components in communication with each other does not imply that all such components are required. On the contrary, a variety of optional components are described to illustrate the wide variety of possible embodiments of the invention.

The present disclosure may be realized in hardware, or a combination of hardware and software. The present disclosure may be realized in a centralized fashion, in at least one processing system, or in a distributed fashion, where different elements may be spread across several interconnected systems or circuits.

Further, any of the methods described herein may be totally or partially performed using a digital camera, including one or more processors, which is configured to perform the steps described herein above. Thus, embodiments are directed towards a digital camera including specific components to perform specific steps of any of the methods described herein above. Additionally, any of the steps of any of the methods can be performed using specific circuits.

A person with ordinary skills in the art will appreciate that the systems, circuit elements, modules, and submodules have been illustrated and explained to serve as examples and should not be considered limiting in any manner. It will be further appreciated that the variants of the above disclosed circuit elements, modules, and other features and functions, or alternatives thereof, may be combined to create other different systems or applications.

While the present disclosure has been described with reference to certain embodiments and exemplary embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope.

What is claimed is:

1. A method for pixel-embedded signal amplification of a CMOS image sensor using multi-step voltage gain enhancement, the method comprising:
   activating ROW1 of the CMOS image sensor by resetting a plurality of switches $S_{RST}$, $S_{H1}$ and $S_{H2}$ to charge nodes PD1, PD2, SD1, and SD2 to a pre-set voltage potential and $V_{RST}$ respectively;
   switching the plurality of switches OFF $S_{RST}$, $S_{H1}$ and $S_{H2}$ for integration of photo-generated charges at node PD1 for producing a corresponding photo generated signal;
   sampling the photo generated signal by transferring the said signal to a gate of source follower $SF_1$, to produce an amplified photo generated signal;
   double sampling the amplified photo generated signal in column for removing any pixel offset variation to produce a resultant voltage signal;
   activating ROW2 of the CMOS image sensor by resetting the plurality of switches $S_{RST}$, $S_{H1}$ and $S_{H2}$ to charge nodes PD1, PD2, SD1, and SD2 to the pre-set voltage potential and $V_{RST}$ respectively;
   switching the plurality of switches OFF $S_{RST}$, $S_{H1}$ and $S_{H2}$ for integration of photo-generated charges at node $PD_2$ for producing a corresponding photo generated signal;
   sampling the photo generated signal by transferring the said signal to a gate of source follower $SF_2$, to produce an amplified photo generated signal;
   double sampling the amplified photo generated signal in column for removing any pixel offset variation for implementing multiple steps of gain on the resultant voltage signal; and
   converting the resultant voltage to digital bits to obtain an output signal of with enhanced gain.

2. The method for pixel-embedded signal amplification of a CMOS image sensor using multi-step voltage gain enhancement as claimed in claim 1, wherein the resetting of the nodes PD1, PD2, SD1 and SD2 is done by switching ON the switches $S_{RST}$, $S_{H1}$ and $S_{H2}$.

3. The method for pixel-embedded signal amplification of a CMOS image sensor using multi-step voltage gain enhancement as claimed in claim 1, wherein the pre-set voltage potential $V_{RST}$ resets the gates of the parasitic capacitors being $C_{PAR1}$ and $C_{PAR2}$, and wherein a source-drain terminal of the said capacitors is respectively connected to $V_{DD}$, and wherein a pre-set capacitance can further be controlled to a desired voltage level.

4. The method for pixel-embedded signal amplification of a CMOS image sensor using multi-step voltage gain enhancement as claimed in claim 1, wherein the switch $S_{H1}$ is configured for sampling and holding and for transferring the photo-generated signal from photodiode node to the gate of source follower for all odd row pixels i.e., ROW1.

5. The method for pixel-embedded signal amplification of a CMOS image sensor using multi-step voltage gain enhancement as claimed in claim 1, further comprising passing a reset signal at $V_{RST}$ through a multiplication loop with the help of clock $S_{SEL1}$ and $SF_1$, and wherein the reset signal is readout after travelling through the multiplication loop.

6. The method for pixel-embedded signal amplification of a CMOS image sensor using multi-step voltage gain enhancement as claimed in claim 1, wherein when the first row ROW1 is activated, the second row ROW2 provides a MOS capacitor amplifier and buffer to the first row ROW1 for its signal amplification, and when the second row ROW2 is activated, the first row's MOS capacitor structure and buffer are used to amplify the second-row signal.

7. A CMOS image sensor system using multi-step voltage gain enhancement for pixel-embedded signal amplification, comprises:
   a processor; and
   a memory communicatively coupled to the processor, wherein the memory stores processor instructions, which on execution, causes the CMOS image sensor to:
   activate ROW1 of the CMOS image sensor by resetting a plurality of switches $S_{RST}$, $S_{H1}$ and $S_{H2}$ to charge nodes PD1, PD2, SD1, and SD2 to a pre-set voltage potential and $V_{RST}$ respectively;
   switch the plurality of switches OFF $S_{RST}$, $S_{H1}$ and $S_{H2}$ for integration of photo-generated charges at node PD1 for producing a corresponding photo generated signal;
   sample the photo generated signal by transferring the said signal to a gate of source follower $SF_1$, to produce an amplified photo generated signal;
   double sample the amplified photo generated signal in column to remove any pixel offset variation to produce a resultant voltage signal;

activate ROW2 of the CMOS image sensor by resetting the plurality of switches $S_{RST}$, $S_{H1}$ and $S_{H2}$ to charge nodes PD1, PD2, SD1, and SD2 to the pre-set voltage potential and $V_{RST}$ respectively;

switch the plurality of switches OFF $S_{RST}$, $S_{H1}$ and $S_{H2}$ for integration of photo-generated charges at node PD2 for producing a corresponding photo generated signal;

sample the photo generated signal by transferring the said signal to a gate of source follower $SF_2$, to produce an amplified photo generated signal;

double sample the amplified photo generated signal in column for removing any pixel offset variation to implement multiple steps of gain on the resultant voltage signal; and convert the resultant voltage to digital bits to obtain an output signal of with enhanced gain.

8. The CMOS image sensor as claimed in claim 7, wherein the nodes PD1, PD2, SD1 and SD2 are reset by switching ON the switches $S_{RST}$, $S_{H1}$ and $S_{H2}$.

9. The CMOS image sensor as claimed in claim 7, wherein the pre-set voltage potential $V_{RST}$ resets the gates of the parasitic capacitors being $C_{PAR1}$ and $C_{PAR2}$, and wherein a source-drain terminal of the said capacitors is respectively connected to $V_{DD}$, and wherein a pre-set capacitance can further be controlled to a desired voltage level.

10. The CMOS image sensor as claimed in claim 7, wherein the switch $S_{H1}$ is configured to be a sample and hold switch to transfer the photo-generated signal from photo-diode node to the gate of source follower for all odd row pixels i.e., ROW1.

11. The CMOS image sensor as claimed in claim 7, wherein a reset signal at $V_{RST}$ is made to pass through a multiplication loop with the help of clock $S_{SEL1}$ and $SF_1$, and wherein the reset signal is readout after travelling through the multiplication loop.

12. The CMOS image sensor as claimed in claim 7, wherein the first row ROW1 is activated, the second row ROW2 provides the MOS capacitor amplifier and buffer to the first row ROW1 for its signal amplification, and when the second row ROW2 is activated, the first row's MOS capacitor structure and buffer are used to amplify the second-row signal.

13. A CMOS image sensor system for pixel-embedded signal amplification of a CMOS image sensor using multi-step voltage gain enhancement, comprises:
a plurality of switches being $S_{H1}$, $S_{RST}$, and $S_{H2}$;
a plurality of in-pixel source followers $SF_1$ and $SF_2$;
an in-pixel amplifier;
a plurality of externally supplied control clocks $S_{SEL1}$ and $S_{SEL2}$;
at least one photodiode to generate the photo signal PD1 and PD2;
a plurality of parasitic capacitances being $C_{COL}$, $C_{PAR1}$ and $C_{PAR2}$; and
a column current source $I_{BIAS}$.

14. The CMOS image sensor system as claimed in claim 13, wherein the photodiode is an n-well and p-sub photodiode or a p+, n-well, and p-sub pinned photodiode.

15. The CMOS image sensor system as claimed in claim 13, wherein sample and hold switches, being $S_{H1}$ and $S_{H2}$, are alternatively configured to transfer a photo-generated signal from the photodiode node to gate of the source followers alternatively for ROW1 and ROW2.

16. The CMOS image sensor system as claimed in claim 13, wherein $S_{SEL1}$ and $S_{SEL2}$ are clocks for ROW1 and ROW2 respectively.

17. The CMOS image sensor system as claimed in claim 13, wherein $SF_1$ and $SF_2$ are source followers for ROW1 and ROW2 respectively.

18. The CMOS image sensor system as claimed in claim 13, further comprises of parasitic capacitances $C_{PAR1}$ and $C_{PAR2}$ for ROW1 and ROW2 respectively, and wherein the said capacitances are respectively formed the gate node of the source follower due to all connected transistors to that node for each odd row pixel, and in ROW2 Parasitic capacitance $C_{PAR2}$ formed at the gate node of the source follower due to all connected transistors to that node for each even row pixel.

19. The CMOS image sensor system as claimed in claim 13, wherein the parasitic capacitances at the source follower $SF_1$ and $SF_2$ provide an amplification gain to a signal.

* * * * *